(12) United States Patent
Kumar et al.

(10) Patent No.: US 7,800,932 B2
(45) Date of Patent: Sep. 21, 2010

(54) MEMORY CELL COMPRISING SWITCHABLE SEMICONDUCTOR MEMORY ELEMENT WITH TRIMMABLE RESISTANCE

(75) Inventors: Tanmay Kumar, Pleasanton, CA (US); S. Brad Herner, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 112 days.

(21) Appl. No.: 11/237,167

(22) Filed: Sep. 28, 2005

(65) Prior Publication Data
US 2007/0090425 A1 Apr. 26, 2007

(51) Int. Cl.
G11C 11/00 (2006.01)
G11C 11/14 (2006.01)
G11C 11/15 (2006.01)

(52) U.S. Cl. .................. 365/148; 365/158; 365/163; 365/171; 365/173; 365/175

(58) Field of Classification Search .......... 365/158, 365/171, 173, 148, 163, 175; 438/3; 36/158, 36/171, 173; 257/295
See application file for complete search history.

(56) References Cited

U.S. PATENT DOCUMENTS

| 4,646,266 A | 2/1987 | Ovshinsky et al. |
| 4,665,428 A | 5/1987 | Hockley et al. |
| 5,166,760 A | 11/1992 | Mori et al. |
| 5,432,729 A | 7/1995 | Carson et al. |
| 5,559,732 A | 9/1996 | Birge |
| 5,693,556 A | 12/1997 | Cleeves |
| 5,745,407 A | 4/1998 | Levy et al. |
| 5,751,012 A | 5/1998 | Wolstenholme et al. |
| 5,835,396 A | 11/1998 | Zhang |
| 5,915,167 A | 6/1999 | Leedy |
| 5,962,911 A | 10/1999 | Manley |
| 5,991,193 A | 11/1999 | Gallagher et al. |

(Continued)

FOREIGN PATENT DOCUMENTS

EP 1 450 373 A1 8/2004

(Continued)

OTHER PUBLICATIONS

Alavi, et al., "A PROM Element Based on Salicide Agglomeration of Poly Fuses in a CMOS Logic Process", IDEM 97, (1997), 855-858.

(Continued)

*Primary Examiner*—Trong Phan
(74) *Attorney, Agent, or Firm*—The Marbury Law Group PLLC

(57) ABSTRACT

A nonvolatile memory cell comprising doped semiconductor material and a diode can store memory states by changing the resistance of the doped semiconductor material by application of a set pulse (decreasing resistance) or a reset pulse (increasing resistance.) Set pulses are of short duration and above a threshold voltage, while reset pulses are longer duration and below a threshold voltage. In some embodiments multiple resistance states can be achieved, allowing for a multi-state cell, while restoring a prior high-resistance state allows for an rewriteable cell. In some embodiments, the diode and a switchable memory formed of doped semiconductor material are formed in series, while in other embodiments, the diode itself serves as the semiconductor switchable memory element.

19 Claims, 7 Drawing Sheets

U.S. PATENT DOCUMENTS

| | | | |
|---|---|---|---|
| 6,014,330 | A | 1/2000 | Endoh et al. |
| 6,034,882 | A | 3/2000 | Johnson et al. |
| 6,111,784 | A | 8/2000 | Nishimura et al. |
| 6,187,617 | B1 | 2/2001 | Gauthier et al. |
| 6,236,587 | B1 | 5/2001 | Gudesen et al. |
| 6,306,718 | B1 | 10/2001 | Singh et al. |
| 6,420,215 | B1 | 7/2002 | Knall et al. |
| 6,483,736 | B2 | 11/2002 | Johnson et al. |
| 6,486,065 | B2 | 11/2002 | Vyvoda et al. |
| 6,525,953 | B1 | 2/2003 | Johnson |
| 6,541,312 | B2 | 4/2003 | Vyvoda et al. |
| 6,567,301 | B2 | 5/2003 | Anthony et al. |
| 6,584,029 | B2 | 6/2003 | Tran et al. |
| 6,677,220 | B2 | 1/2004 | Van Brocklin et al. |
| 6,689,644 | B2 | 2/2004 | Johnson |
| 6,693,823 | B2 | 2/2004 | Brown |
| 6,735,111 | B2 | 5/2004 | Nejad |
| 6,777,773 | B2 | 8/2004 | Knall |
| 6,834,008 | B2 * | 12/2004 | Rinerson et al. ............ 365/158 |
| 6,844,564 | B2 | 1/2005 | Tanaka et al. |
| 6,847,544 | B1 * | 1/2005 | Smith et al. ................. 365/158 |
| 6,873,543 | B2 * | 3/2005 | Smith et al. ................. 365/158 |
| 6,879,508 | B2 | 4/2005 | Tran |
| 6,881,994 | B2 | 4/2005 | Lee et al. |
| 6,916,740 | B2 * | 7/2005 | Kamins ......................... 438/1 |
| 6,946,719 | B2 | 9/2005 | Petti et al. |
| 6,951,780 | B1 | 10/2005 | Herner |
| 6,952,030 | B2 | 10/2005 | Herner et al. |
| 6,952,043 | B2 | 10/2005 | Vyvoda et al. |
| 6,965,137 | B2 * | 11/2005 | Kinney et al. ............... 257/295 |
| 6,999,366 | B2 * | 2/2006 | Perner et al. ................ 365/158 |
| 7,038,248 | B2 | 5/2006 | Lee |
| 7,071,008 | B2 * | 7/2006 | Rinerson et al. ............... 438/3 |
| 7,126,855 | B2 | 10/2006 | Honda et al. |
| 7,176,064 | B2 | 2/2007 | Herner |
| 7,180,815 | B2 | 2/2007 | Fujiu et al. |
| 7,283,403 | B2 * | 10/2007 | Johnson ................. 365/230.06 |
| 7,453,755 | B2 | 11/2008 | Cleeves |
| 7,488,625 | B2 | 2/2009 | Knall |
| 2004/0016991 | A1 | 1/2004 | Herner et al. |
| 2004/0160818 | A1 | 8/2004 | Rinerson et al. |
| 2004/0161888 | A1 | 8/2004 | Rinerson et al. |
| 2004/0222467 | A1 | 11/2004 | Yamazaki et al. |
| 2004/0228159 | A1 | 11/2004 | Kostylev et al. |
| 2004/0232509 | A1 | 11/2004 | Vyvoda |
| 2005/0052915 | A1 | 3/2005 | Herner et al. |
| 2005/0063220 | A1 | 3/2005 | Johnson |
| 2005/0098800 | A1 | 5/2005 | Herner et al. |
| 2005/0121742 | A1 | 6/2005 | Petti et al. |
| 2005/0121743 | A1 | 6/2005 | Herner |
| 2006/0250836 | A1 | 11/2006 | Herner et al. |
| 2006/0250837 | A1 | 11/2006 | Herner et al. |
| 2007/0069276 | A1 | 3/2007 | Scheuerlein et al. |
| 2008/0017912 | A1 | 1/2008 | Kumar et al. |

FOREIGN PATENT DOCUMENTS

| | | |
|---|---|---|
| TW | 588352 | 5/2004 |
| TW | I225716 | 12/2004 |
| WO | WO 2004/055827 A1 | 7/2004 |

OTHER PUBLICATIONS

Amemiya, Yoshito, et al., "Electrical Trimming of Heavily Doped Polycrystalline Silicon Resistors", IEEE Transactions Electron Devices, vol. ED-26, No. 11 (Nov. 1979), 1738-1742.
Babcock, J.A., "Polysilicon Resistor Trimming for Packaged Integrated Circuits", IDEM 93, (1993), 247-250.
Babcock, J.A., "Precision Electrical Trimming of Very Low TCR Poly-SiGe Resistors", IEEE Electron Device Letters, vol. 21, No. 6, (Jun. 2000), 283-285.
Das, Soumen, et al., "A Large-Bias Conduction Model of Polycrystalline Silicon Films", IEEE Transactions on Electron Devices, vol. 41, No. 4, (Apr. 1994), 524-532.
Das Soumen, et al., "Electrical Trimming of Ion-Beam-Sputtered Polysilicon Resistors by High Current Pulses", IEEE Transaction on Electron Devices, vol. 41, No. 8, (Aug. 1994), 1429-1434.
Feldbaumer, D.W., "Pulse Current Trimming of Polysilicon Resistors", IEEE Transactions on Electron Devices, vol. 42, No. 4, (Apr. 1995), 689-696.
Feldbaumer, D.W., et al., "Theory and Application of Polysilicon Resistor Trimming", Solid-State Electronics, vol. 38, 11, (Jan. 1995), 1861-1869.
Kato, Kotaro, et al., "A Monolithic 14 Bit D/A Converter Fabricated with a New Trimming Technique (DOT)," IEEE Journal of Solid-State Circuits, vol. SC-19, No. 5, (Oct. 1984), 802-804-806.
Kato Kotaro, et al., "A Physical Mechanism of Current-Induced Resistance Decrease in Heavily Doped Polysilicon Resistors", IEEE Transaction on Electron Devices, vol. ED-29, No. 8, (Aug. 1982), 1156-1160.
Kato Kotaro, et al., "Change in Temperature Coefficient of Resistance of Heavily Doped Polysilicon Resistors Caused by Electrical Trimming", Jpn. J. Appl. Phys. vol. 35, Part 1, No. 8, (Aug. 1996), 4209-4215.
Kato, Kotaro, et al., "Constant Voltage Trimming of Heavily Doped Polysilicon Resistors", Jpn. Jnl. Appl. Phys. vol. 34, Part 1, No. 1, (Jan. 1995), 48-53.
Lane, William A., "The Design of Thin-Film Polysilicon Resistors for Analog IC Applications", IEEE Transactions on Electron Devices, vol. 36, No. 4, (Apr. 1989), 738-744.
Tobita, Toshio, "New Trimming Technology of a Thick Film Resistor by the Pulse Voltage Method", IEEE Transactions on Components, Hybrids and Manufacturing Technology, vol. 14, No. 3, (Sep. 1991), 613-617.
Babcock, et al., "Precision Electrical Trimming of Very Low TCR Poly-Sige Resistors," IEEE Service Center, New York, NY, vol. 21, No. 6, Jun. 2000, pp. 283-285, XP000951962 ISSN: 0741-3106, abstract Figs. 2,4.
U.S. Appl. No. 10/095,962, filed Mar. 13, 2002, Herner et al.
U.S. Appl. No. 10/185,507, filed Jun. 27, 2002, Vyvoda et al.
U.S. Appl. No. 10/440,882, filed May 19, 2003, Vyvoda et al.
U.S. Appl. No. 10/728,436, filed Dec. 5, 2003, Chen.
U.S. Appl. No. 10/728,451, filed Dec. 5, 2003, Cleeves et al.
U.S. Appl. No. 10/815,312, filed Apr. 1, 2004, Chen.
U.S. Appl. No. 10/883,417, filed Jun. 30, 2004, Raghuram et al.
U.S. Appl. No. 10/954,510, filed Sep. 29, 2004, Herner.
U.S. Appl. No. 11/148,530, filed Jun. 8, 2006, Herner et al.
U.S. Appl. No. 11/395,995, filed Mar. 31, 2006, Herner et al.
U.S. Appl. No. 11/444,936, filed May 31, 2006, Radigan et al.
Chiang, Steve et al., "Antifuse Structure Comparison for Field Programmable Gate Arrays", IEDM 92-611, Apr. 1992, pp. 24.6.1-24.6.4.
Hamdy, Esmat et al., "Dielectric Based Antifuse for Logic and Memory ICs", IEDM 88, 1998, pp. 786-789.
Hatalis, Miltiadis K., et al., "Large grain polycrystalline silicon by low-temperature annealing of low-pressure chemical vapor deposited amorphous silicon films", J. Appl. Phys., vol. 63, No. 7, Apr. 1988, pgs. 2260-2266.
Herner, S. B. et al., "Polycrystalline silicon/CoSi2 Schottky diode with integrated SiO2 antifuse: a nonvolatile memory cell", Applied Physics Letters, vol. 82, No. 23, Jun. 2003, pp. 4163-4165.
Holloway, Karen et al., "Amorphous Ti-Si alloy formed by interdiffusion of amorphous Si and crystalline Ti multilayers", J. Appl. Phys., vol. 61, No. 4, Feb. 1987, pp. 1359-1364.
Kim, Tae-Kyun et al., "Oxidation behavior of a patterned TiSi2/polysilicon stack", J. Vac. Sci. Technol. B., vol. 19, No. 2, Mar./Apr. 2001, pp. 366-371.
Konakova, R. V. et al., "Ohmic Contacts for Microwave Diodes", Proc. 22$^{nd}$ International Conference on Microelectronics (MIEL 2000), vol. 2, NIS Serbia, May 14-17, 2000, Jan. 1999, pp. 477-480.
Mahan, J.E. et al., "Threshold and Memory Switching in Polycrystalline Silicon", Applied Physics Letter, vol. 41, No. 5, Sep. 1982, pp. 479-481.

Malhotra, Vinod et al., "An Electrothermal Model of Memory Switching in Vertical Polycrystalline Silicon Structures", IEEE Transactions of Electron Devices, vol. 35, No. 9, Sep. 1988, pp. 1514-1523.

Shih, Chih-Ching et al., "Characterization and Modeling of a Highly Reliable Metal-to-Metal Antifuse for High-Performance and High-Density Field-Programmable Gate Arrays", 1997 IEEE, Sep. 1997, pp. 25-33.

Tang, Qiang et al., "Twinning in TiSi2-island catalyzed Si nanowires grown by gas-source molecular-beam epitaxy", Applied Physics Letters, vol. 81, No. 13, Sep. 2002, pp. 2451-2453.

Tung, R. T., "Oxide mediated epitaxy of CoSi2 on silicon", Appl. Phys. Lett., vol. 68, No. 24, Jun. 1996, pp. 3461-3463.

Wang, Shoue-Jen et al., "High-Performance Metal/Silicide Antifuse", IEEE Electron Device Letters, vol. 13, No. 9, Sep. 1992, pp. 471-472.

International Search Report dated Oct. 8, 2008 received in corresponding International Application No. PCT/US2008/007800.

Office Action dated Nov. 24, 2008 received in corresponding U.S. Appl. No. 11/693,845.

Taiwan Search Report dated Jan. 4, 2009 received in corresponding Taiwan application No. 095135852.

Office Action dated Jul. 31, 2009 received in related U.S. Appl. No. 11/496,986.

Office Action dated Apr. 20, 2009 received in U.S. Appl. No. 11/819,595.

Office Action dated Apr. 24, 2009 received in U.S. Appl. No. 11/693,858.

Office Action dated Sep. 25, 2009 received in U.S. Appl. No. 11/819,595.

* cited by examiner

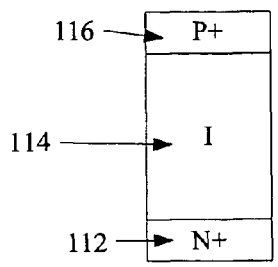
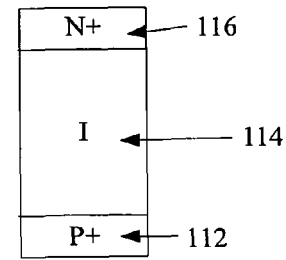
Fig. 6a  Fig. 6b
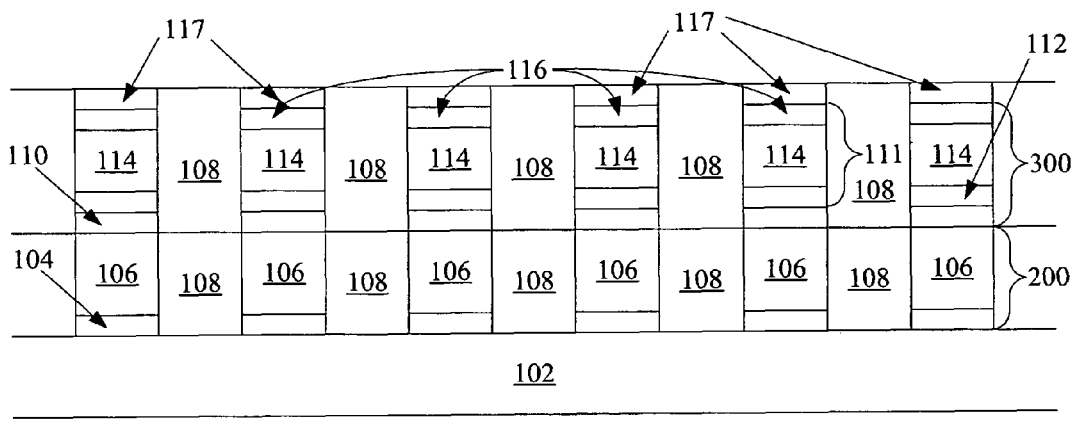
Fig. 7
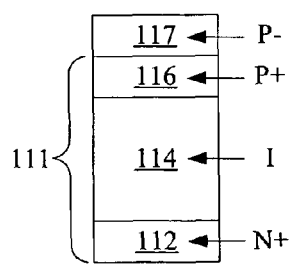
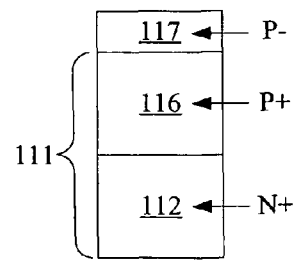
Fig. 8a  Fig. 8b

MEMORY CELL COMPRISING SWITCHABLE SEMICONDUCTOR MEMORY ELEMENT WITH TRIMMABLE RESISTANCE

BACKGROUND OF THE INVENTION

The invention relates to a nonvolatile memory array.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states, or bits, each cell can achieve. A data state may be stored by altering some characteristic of the cell which can be detected, such as current flowing through the cell under a given applied voltage or the threshold voltage of a transistor within the cell.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices which are relatively difficult to fabricate and operate at the very small dimensions required for competitiveness in modern integrated circuits.

Other memory cells operate by changing the resistivity of relatively exotic materials, like chalcogenides. Chalcogenides are difficult to work with and can present challenges in most semiconductor production facilities.

A substantial advantage would be provided by a nonvolatile memory array having erasable or multi-state memory cells formed using conventional semiconductor materials in structures that are readily scaled to small size.

SUMMARY OF THE PREFERRED EMBODIMENTS

The present invention is defined by the following claims, and nothing in this section should be taken as a limitation on those claims. In general, the invention is directed to a nonvolatile memory cell having a diode and a semiconductor element with trimmable resistance.

A first aspect of the invention provides for a method for changing and sensing data states for a nonvolatile memory cell, the method comprising: switching semiconductor material from a first stable resistivity state to a second stable resistivity state, the second resistivity state lower resistivity than the first resistivity state; switching the semiconductor material from the second stable resistivity state to a third stable resistivity state, the third resistivity state higher resistivity than the second resistivity state; and sensing the first resistivity state, the second resistivity state, or the third resistivity state as a data state of the memory cell, wherein the memory cell comprises a portion of a first conductor; a portion of a second conductor; and a switchable memory element comprising the semiconductor material, the switchable memory element disposed between the first and second conductors.

Another aspect of the invention provides for a method for changing data states for a nonvolatile memory cell, the method comprising: switching semiconductor material from a first stable resistivity state to a second stable resistivity state, the second resistivity state lower resistivity than the first resistivity state, switching the semiconductor material from the second resistivity state to a third stable resistivity state, the third resistivity state lower resistivity than the second resistivity state, wherein the memory cell comprises a first conductor; a second conductor; and a switchable memory element disposed between the first conductor and the second conductor, the switchable memory element comprising the semiconductor material.

A preferred embodiment of the invention provides for a method for changing and sensing data states in a nonvolatile memory cell, the method comprising: applying a first set voltage to a switchable memory element comprising doped semiconductor material, wherein the first set voltage changes the doped semiconductor material from a first resistivity state to a second resistivity state, the second resistivity state lower resistivity than the first resistivity state; applying a second set voltage to the switchable memory element, wherein the second set voltage changes the doped semiconductor material from the second resistivity state to a third resistivity state, the third resistivity state lower resistivity than the second resistivity state; and applying a read voltage to the switchable memory element, wherein the read voltage does not substantially change the resistance of the switchable memory element, wherein the memory cell comprises a portion of a first conductor, a portion of a second conductor, and the switchable memory element disposed between the first and second conductors, wherein the second conductor is disposed above the first conductor.

Another preferred embodiment of the present invention provides for a method for setting and sensing data states in a nonvolatile memory cell, the method comprising: applying a first set voltage to a switchable memory element comprising doped semiconductor material, wherein the first set voltage changes the semiconductor material from a first resistivity state to a second resistivity state, the second resistivity state lower resistivity than the first resistivity state; applying a first reset voltage to the switchable memory element, wherein the first reset voltage changes the semiconductor material from the second resistivity state to a third resistivity state, the third resistivity state higher resistivity than the second resistivity state; and applying a read voltage to the switchable memory element, wherein the read voltage does not substantially change the resistance of the switchable memory element, wherein the memory cell comprises a portion of a first conductor, a portion of a second conductor, and the switchable memory element disposed between the first and second conductors.

Yet another preferred embodiment provides for a method for programming a selected memory cell in a monolithic three dimensional memory array, the monolithic three dimensional memory array comprising: a) a first memory level formed above a substrate, the first memory level comprising a first plurality of memory cells, wherein the selected cell is one of the first memory cells, and the selected cell comprises: i) a portion of a first conductor extending in a first direction; ii) a portion of a second conductor extending in a second direction different from the first direction, the second conductor above the first conductor; iii) a switchable memory element consisting essentially of doped semiconductor material, the switchable memory element disposed between the first conductor and the second conductor; and b) a second memory level monolithically formed above the first memory level, the method comprising: applying a first set voltage to the switchable memory element wherein the first set voltage changes the switchable memory element from a first resistance state to a second resistance state, the second resistance state lower resistance than the first resistance state; applying a second set voltage to the switchable memory element, wherein the second set voltage changes the switchable memory element from the second resistance state to a third resistance state, the third resistance state lower resistance than the second resistance state, wherein the second set voltage has higher electrical amplitude than the first set voltage; and applying a read voltage to the switchable memory element, wherein the read voltage has lower electrical amplitude than the first set voltage.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIGS. 6a and 6b are cross-sectional views illustrating different diode configurations in an embodiment of the present invention.

FIG. 7 is a cross-sectional view illustrating a stage in formation of a memory level in an alternative embodiment of the present invention.

FIGS. 8a and 8b are cross-sectional views showing two embodiments of a diode and resistive semiconductor element in series formed according to an embodiment Of the present invention.

DETAILED DESCRIPTION OF THE PREFERRED EMBODIMENTS

Herner et al., U.S. patent application Ser. No. 10/955,549, "Nonvolatile Memory Cell Without a Dielectric Antifuse Having High- and Low-Impedance States," filed Sep. 29, 2004, hereinafter the '549 application and hereby incorporated by reference, describes a monolithic three dimensional memory array in which the data state of a memory cell is stored in the resistance state of a polycrystalline semiconductor diode. This memory cell is a one-time-programmable cell having two data states. The diode is formed in a high-resistance state; application of a programming voltage permanently transforms the diode to a low-resistance state.

In embodiments of the present invention, by applying appropriate electrical pulses, a memory element formed of doped semiconductor material, in one embodiment similar to the cell of the '549 application, can achieve three, four, or more stable resistance states. In other embodiments of the present invention, such a semiconductor memory element can be set from an initial high-resistance state to a low-resistance state; then, upon application of an appropriate electrical pulse, can be reset to a higher-resistance state. These embodiments can be used independently or combined to form a rewriteable, multi-state memory cell. In an alternative set of embodiments, a polycrystalline semiconductor diode is paired with a semiconductor element having trimmable resistance.

Figure 1:
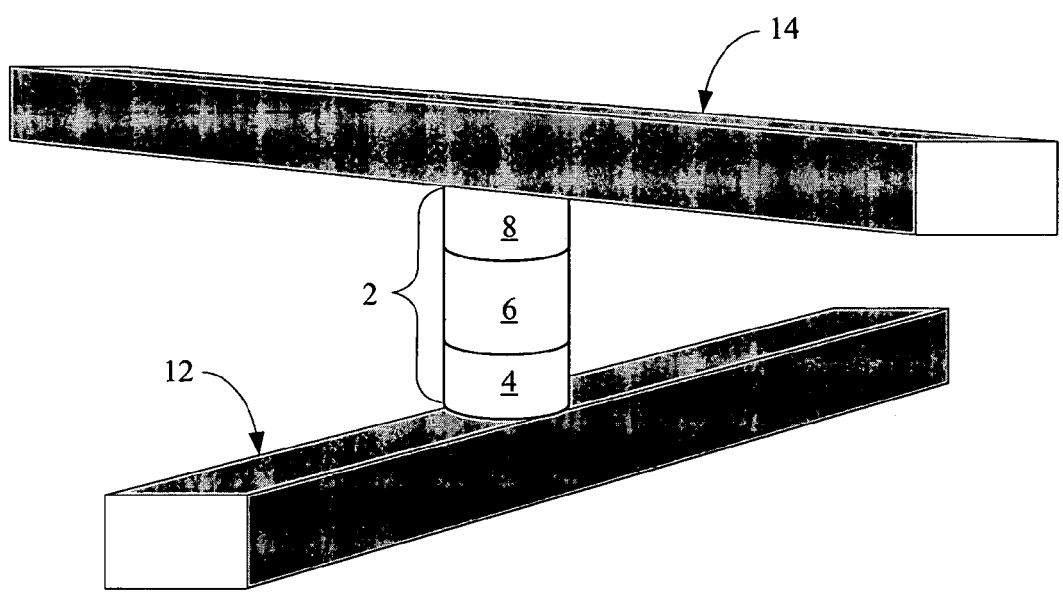
FIG. 1 is a perspective view of a multi-state or rewriteable memory cell formed according to a preferred embodiment of the present invention.

FIG. 1 illustrates a multi-state or rewriteable memory cell formed according to a preferred embodiment of the present invention. A bottom conductor 12 is formed of a conductive material, for example tungsten, and extends in a first direction. Barrier and adhesion layers may be included in bottom conductor 12. Polycrystalline semiconductor diode 2 is a p-i-n diode having a bottom heavily doped n-type region 4; an intrinsic region 6, which is not intentionally doped; and a top heavily doped region 8. Top conductor 14 may be formed in the same manner and of the same materials as bottom conductor 12, and extends in a second direction different from the first direction. Polycrystalline semiconductor diode 2 is vertically disposed between bottom conductor 12 and top conductor 14. Polycrystalline semiconductor diode 2 is formed in a high-resistance state. This memory cell can be formed above a substrate, for example above a monocrystalline silicon wafer.

The resistivity of doped polycrystalline, amorphous, or microcrystalline semiconductor material, for example silicon, can be changed between stable states by applying appropriate electrical pulses.

Figure 2:
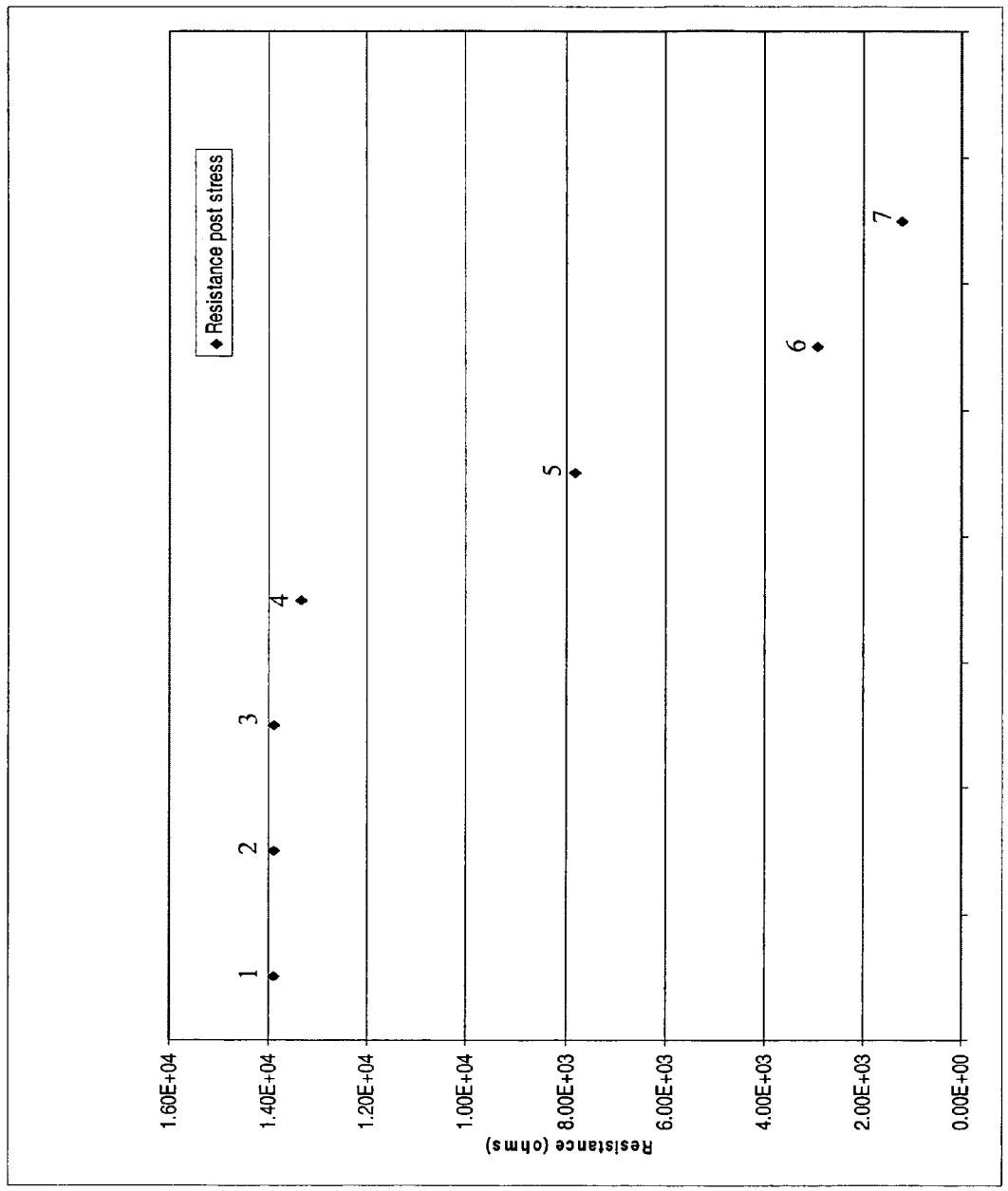
FIG. 2 is a graph showing a series of resistance states with steadily decreasing resistance induced by application of set pulses.

The resistance of vertically oriented resistors formed of polycrystalline silicon (polycrystalline silicon will be referred to in this discussion as polysilicon; similarly, polycrystalline germanium will be called polygermanium) was measured. Turning to FIG. 2, the polysilicon resistors were formed in a high-resistance state, with resistance of about 14 kOhms, shown at point 1.

It was found that application of an appropriate set pulse decreased resistance of the polysilicon. A set pulse is a pulse of relatively short duration, in this example of about 1 msec. In order to decrease resistance, a set pulse needed to be at or above a threshold amplitude, which changed with resistance.

The initial resistance state was at point 1. After application of a set pulse of 1 msec of 5 volts, the resistance was virtually unchanged at point 2. (This example will describe electrical amplitude in terms of voltage, though it will be understood that they could be described in terms of current instead.) Resistance was also essentially unchanged at point 3 after application of a 7-volt set pulse for 1 msec. These voltages, 5 and 7 volts, were apparently below the voltage sufficient to cause a change in resistance, which will be called a threshold voltage, for the resistance state at points 1 and 2.

A 9-volt set pulse applied for 1 msec at resistance point 3 caused a small drop in resistance to point 4 to 1.3 kOhms. The set pulse of 9 volts was apparently approaching the threshold voltage. After application of an 11-volt set pulse for 1 msec, at a voltage clearly above the threshold voltage, the resistance of the polysilicon resistor was substantially reduced, at 7.8 kOhms, shown at point 5. Thus 11 volts was above the threshold voltage at resistance point 4, and a set pulse having this voltage reduced resistance.

At point 5, however, the threshold voltage was apparently increased: Application of a set pulse of about 11 volts or less caused no change in the resistance at point 5. Application of a set pulse of a higher voltage, 13 volts, decreased resistance further, to about 2.9 kOhms at point 6. At point 6 the threshold voltage increased again, and a set pulse of 15 volts was required to decrease resistance to about 1.2 kOhms at point 7.

Application of a significantly higher voltage, for example about 17 volts, greatly increased resistance (not shown), and no further change was observed. It is assumed that this very high voltage destroyed the resistor.

To summarize, at each resistance state, resistance can be lowered by application of an electrical pulse at or above a threshold amplitude (voltage or current), by a set pulse, i.e. a pulse of relatively short duration. At the resistance of points 1 and 2, for example, the threshold voltage was apparently about 9 volts. Application of set pulses below the threshold voltage did not change resistance, while a set pulse above this threshold voltage did.

Once the polysilicon resistor was in resistance state 5, the threshold voltage changed to about 11 volts, and application of voltage pulses below the threshold voltage did not cause a change in resistance. At point 6 the threshold voltage was about 13 volts, and at point 7, the threshold voltage was about 15 volts. It is expected that as the voltage of the set pulse exceeds the threshold voltage by a greater amount, the reduction in resistance will be greater. For example, had 15 volts been applied to the polysilicon resistor at point 4, the resistance after the 15 volt pulse would have been less than at point 5, when a set pulse of only 11 volts was applied.

In contrast, it was found that application of an appropriate reset pulse increased resistance of the polysilicon. A reset pulse is a pulse of relatively longer duration, in this example of about 20, 30, or 50 msec. In order to increase resistance, a reset pulse needed to be below the threshold amplitude.

Figure 3:
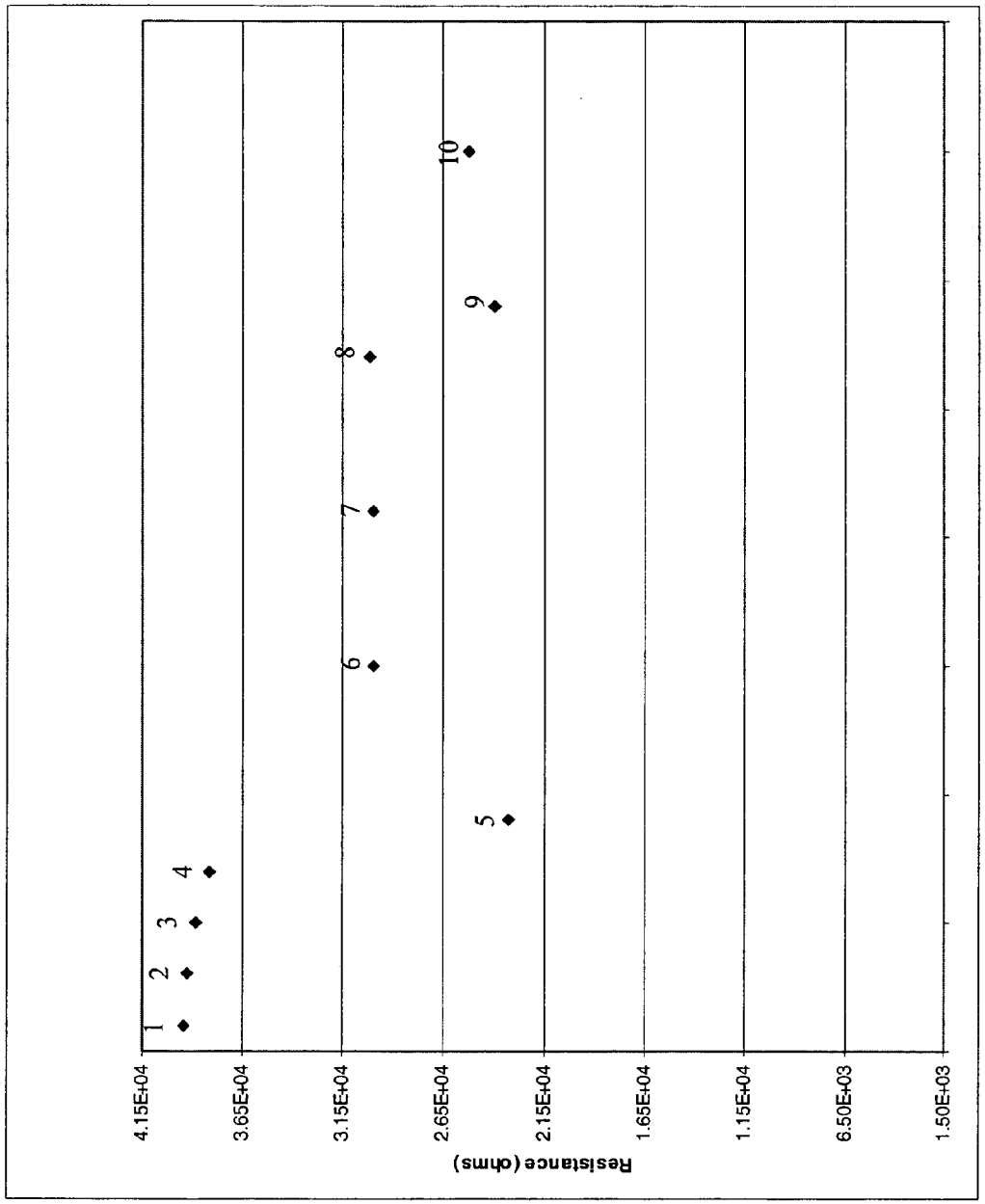
FIG. 3 is a graph showing a series of resistance states in which resistance is decreased by application of a set pulse, then recovered by application of a reset pulse.

FIG. 2 showed application of a set pulse to lower resistance. In FIG. 3, the initial resistance is about 39 kOhms. Application of a 9-volt set pulse to the polysilicon resistor at point 4 drops resistance to 23 kOhms at point 5. Point 5 is a stable state, and application of set pulses at less than the threshold voltage of about 9 volts did not change resistance.

It was found, however, that application of a reset pulse, with longer duration and lower amplitude, served to increase resistance. For example, at resistance point 5 when a reset pulse (50 msec) of 5 volts was applied, resistance increased to 30 kOhms at point 6. This was a stable state with a threshold voltage of about 8 volts. Set pulses less than this amplitude did not change resistance, as shown by points 7 and 8.

As before, a set pulse above the threshold voltage lowered resistance: Application of a high-amplitude set pulse, for example about 8 volts for about 1 msec (short duration) dropped resistance to 24 kOhms at point 9. Set pulse less the threshold voltage did not substantially change resistance, as shown by point 10. Thus resistance could be trimmed between high- and low-resistance states.

In short, by applying appropriate set and reset pulses, doped polysilicon was trimmed to a variety of stable resistance states, which were selected by the amplitude and duration of the pulse. Any of these stable resistance states can be used to store a data state in a memory cell comprising such a trimmable semiconductor element. By setting a variety of resistance states, as shown in FIG. 2, the cell can store multiple data states, and thus store more than one bit per cell. By setting the cell to lower resistance and resetting to higher resistance, as in FIG. 3, such a memory call can be a rewriteable memory cell. These two aspects can be combined to form a rewriteable multi-bit nonvolatile memory cell. It is believed that the trimmable semiconductor element can be formed of silicon, germanium, or alloys of silicon and/or germanium. The difference between resistance states can be a factor of two, a factor of ten, or more.

Without wishing to be bound by any one theory, it is believed that one possible mechanism behind the observed changes in resistance is that set pulses above the threshold amplitude cause dopant atoms to move out of grain boundaries, where they are inactive, into the body of a crystal where they will increase conductivity and lower the resistance of the semiconductor element. In contrast, reset pulses, below the threshold amplitude and of longer duration, cause dopant atoms to move back to the grain boundaries, lowering conductivity and increasing resistance. It may be, however, that other mechanisms, such as an increase and decrease in degree of order of the polycrystalline material, are operating as well or instead.

Figure 4:
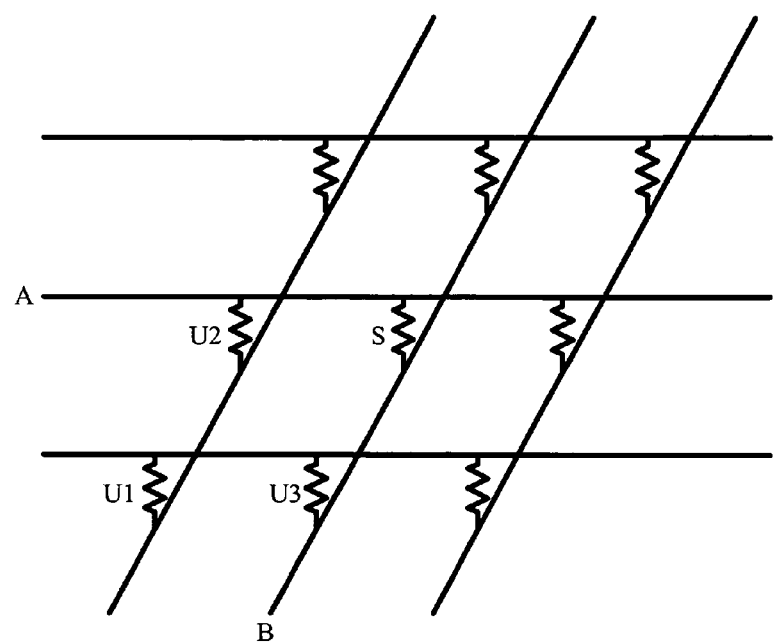
FIG. 4 is a circuit diagram illustrating the need for electrical isolation between memory cells in a memory array.

Making a memory array of polysilicon resistors, however, presents difficulties. If resistors are used as memory cells in a large cross-point array, when voltage is applied to a selected cell, there will be undesired leakage through half-selected and unselected cells throughout the array. For example, turning to FIG. 4, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

Leakage current can be greatly reduced by including a diode in each memory cell. A diode has a non-linear I-V characteristic, allowing very little current flow below a turn-on voltage, and substantially higher current flow above the turn-on voltage. In general a diode also act as one-way valves passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 4) can be greatly reduced.

In preferred embodiments of the present invention, then, a polycrystalline, amorphous, or microcrystalline semiconductor memory element either is formed in series with a diode or is formed as the diode itself.

A memory cell formed according to an aspect of the present invention, then, can be programmed by a method for changing and sensing data states, the method comprising: switching semiconductor material from a first stable resistivity state to a second stable resistivity state, the second resistivity state lower resistivity than the first resistivity state; switching the semiconductor material from the second stable resistivity state to a third stable resistivity state, the third resistivity state higher resistivity than the second resistivity state; and sensing the first resistivity state, the second resistivity state, or the third resistivity state as a data state of the memory cell, wherein the memory cell comprises a portion of a first conductor; a portion of a second conductor; and a switchable memory element comprising the semiconductor material, the switchable memory element disposed between the first and second conductors. The switchable memory element may be the diode itself, or may be in series with the diode. (This discussion uses the terms resistance state and resistivity state. A material has a resistivity, while a discreet element has a resistance. Changing the resistivity state of semiconductor material changes the resistance state of a semiconductor element comprising the semiconductor material.)

Switching from the first resistivity state to the second resistivity state is achieved by applying to the switchable memory element a first electrical pulse (a set pulse) having a first electrical amplitude and a first pulse width. The first pulse is about 5 msec or less, preferably about 1 msec. Applying an additional short pulse of similar amplitude or greater, for example a second short pulse having a second electrical amplitude no more than 120 percent of the first pulse electrical amplitude, does not cause switching to a higher resistivity state. Switching from the second resistivity state to the third resistivity state is achieved by application of a third electrical pulse having a third electrical amplitude and a third width, wherein the third width is at least five times the second width.

The third width is about 10, 20, 30, or 50 msec, for example about 25 msec. The third electrical amplitude is preferably less than the first electrical amplitude.

In multistate aspects of the invention, the memory cell is programmed by a method comprising: switching semiconductor material from a first stable resistivity state to a second stable resistivity state, the second resistivity state lower resistivity than the first resistivity state, switching the semiconductor material from the second resistivity state to a third stable resistivity state, the third resistivity state lower resistivity than the second resistivity state, wherein the memory cell comprises a first conductor; a second conductor; and a switchable memory element disposed between the first conductor and the second conductor, the switchable memory element comprising the semiconductor material. Subsequently, the first resistivity state, second resistivity state, or third resistivity state (or additional states) can be sensed as a data state of the memory cell.

In this method, switching the semiconductor material from the first resistivity state to the second resistivity state comprises applying to the switchable memory element a first electrical pulse having a first electrical amplitude and a first pulse width. Switching the semiconductor material from the second resistivity state to the third resistivity state comprises applying to the switchable memory element a second electrical pulse having a second electrical amplitude and a second width, the second electrical amplitude greater than the first electrical amplitude. Both the first and second pulses are set pulses, and the second pulse width is not more than about three times the first pulse width.

Detailed examples will be provided describing fabrication of two preferred embodiments of the present invention. Fabrication details from Herner et al., U.S. patent application Ser. No. 10/320,470, "An Improved Method for Making High Density Nonvolatile Memory," filed Dec. 19, 2002, and since abandoned, hereby incorporated by reference, will be useful in formation of the diode of these embodiments, as will information from the '549 application. Useful information may also be derived from Herner et al., U.S. patent application Ser. No. 11/015,824, "Nonvolatile Memory Cell Comprising a Reduced Height Vertical Diode," filed Dec. 17, 2004 and hereby incorporated by reference. To avoid obscuring the invention not all of the detail from these applications will be included, but it will be understood that no information from these applications is intended to be excluded.

Diode as Resistance-Switching Element: Fabrication

Fabrication of a single memory level will be described in detail. Additional memory levels can be stacked, each monolithically formed above the one below it. In this embodiment, a polycrystalline semiconductor diode will serve as the switchable memory element.

Figure 5A:
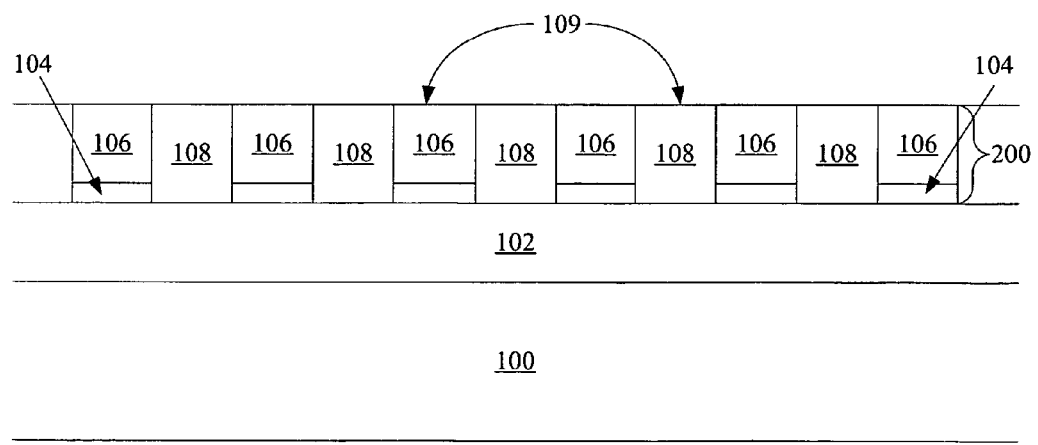
FIGS. 5a-5c are cross-sectional views illustrating stages in formation of a memory level formed according to an embodiment of the present invention.

Turning to FIG. 5a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 5a in cross-section. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 5a. This removal of dielectric overfill to form planar surface 109 can be performed by any process known in the art, such as chemical mechanical planarization (CMP) or etchback. An etchback technique that may advantageously be used is described in Raghuram et al., U.S. application Ser. No. 10/883,417, "Nonselective Unpatterned Etchback to Expose Buried Patterned Features," filed Jun. 30, 2004 and hereby incorporated by reference. At this stage, a plurality of substantially parallel first conductors have been formed at a first height above substrate 100.

Figure 5B:
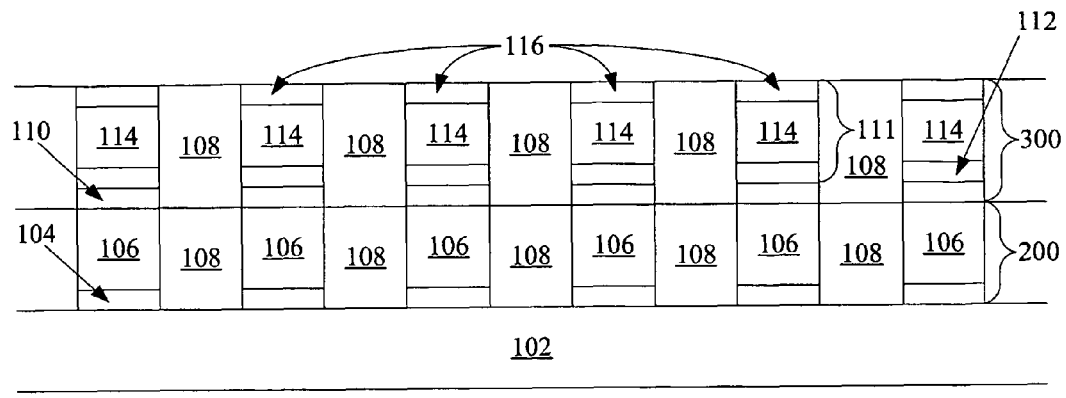

Next, turning to FIG. 5b, vertical pillars will be formed above completed conductor rails 200. (To save space substrate 100 is not shown in FIG. 5b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead.

In preferred embodiments, the pillar comprises a semiconductor junction diode. Turning to FIG. 6a, a preferred junction diode has a bottom heavily doped region 112, intrinsic region 114, and top heavily doped region 116. The conductivity type of bottom region 112 and top region 116 are opposite: Either region 112 is p-type while region 116 is n-type, or region 112 is n-type while region 116 is p-type. Middle region 114 is intrinsic, or not intentionally doped, though in some embodiments it may be lightly doped. An undoped region will never be perfectly electrically neutral, and will always have defects or contaminants that cause it to behave as if slightly n-doped or p-doped.

In FIG. 6a, and in the exemplary array, bottom region 112 will be n-type while top region 116 is p-type. It will be understood that these conductivity types could be reversed, as in FIG. 6b. To form the diode of FIG. 6a, returning to FIG. 5b, bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 100 and about 800 angstroms thick.

Intrinsic layer 114 can be formed by any method known in the art. Layer 114 can be silicon, germanium, or any alloy of silicon or germanium and has a thickness between about 1100 and about 3800 angstrom, preferably about 2600 angstroms.

Returning to FIG. 5b, semiconductor layers 114 and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped p-type top region 116. The p-type dopant is preferably boron or $BCl_3$. This implant step completes formation of diodes 111. The resulting structure is shown in FIG. 5b.

Figure 5C:
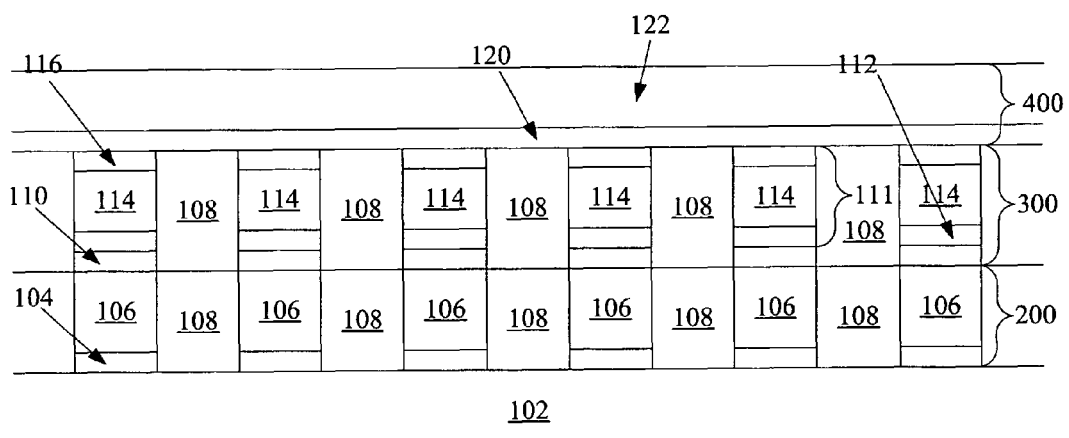

Turning to FIG. 5c, top conductors 400 can be formed in the same manner as bottom conductors 200, for example by depositing adhesion layer 120, preferably of titanium nitride, and conductive layer 122, preferably of tungsten. Conductive layer 122 and adhesion layer 120 are then patterned and etched using any suitable masking and etching technique to form substantially parallel, substantially coplanar conductors 400, shown in FIG. 5c extending left-to-right across the page. In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level of FIG. 5c, its surface planarized, and construction of a second memory level begins on this planarized interlevel dielectric, with no shared conductors.

The p-i-n diodes 111 of the memory cells in the array just described will be formed in a high-resistance state. In each memory cell of this array, set and reset pulses can be applied to each diode 111 to change its resistance. In some embodiments, multiple resistance states can be set, forming a multistate cell. In other embodiments, the diode 111, formed in an initial high-resistance state, can be set to a lower-resistance state by application of a set pulse, then restored to a higher-resistivity state by application of a reset pulse. In other embodiments, the diode 111 may be set to any of multiple lower-resistivity states, then be restored, by application of a reset pulse, to higher-resistivity states, forming a multi-state, rewriteable device. Set pulses can be between about 0.5 msec and about 5 msec. Reset pulses can be between about 10 and about 50 msec. By using a diode rather than a resistor, electrical isolation between neighboring cells can be achieved. In this embodiment, the diode 111 is a switchable memory element disposed between a first conductor 200 and a second conductors 300.

Diode and Resistance-Switching Element in Series: Fabrication

In an alternative embodiment, a resistance-switching semiconductor element is formed in series with a diode.

Turning to FIG. 7, bottom conductors 200 are formed as in the previous embodiment, gaps between them filled with dielectric 108, and a planarization step performed to expose tops of conductors 200.

After deposition of a barrier layer 110, semiconductor material that will form vertically oriented diodes is deposited. In a preferred embodiment, the semiconductor material is germanium or a germanium-rich alloy of silicon and germanium. This discussion will describe the diodes 300 as formed of germanium, though it will be understood that an alloy may be used instead.

The diodes 111 formed in pillars 300 may be p-i-n diodes, as in the previous embodiment, or, for example, p-n diodes. In one embodiment, for example, diodes 111 are p-n diodes. Bottom region 112 is heavily doped n-type polygermanium doped by in situ doping. The rest of the polygermanium is deposited, and is heavily doped with a p-type dopant, for example boron, either by ion implantation or by in situ doping.

In a preferred embodiment, layer 117, of doped silicon, preferably lightly doped in-situ with a p-type dopant such as boron, is deposited at a temperature which will cause the silicon to be amorphous, for example at about 500 degrees C.

After deposition of layer 117, pillars 300 are patterned and etched as in the prior embodiment. Gaps between pillars 300 are filled with dielectric material 108 and a planarization step is performed to expose tops of pillars 300.

Higher temperatures are required to deposit and to crystallize silicon than germanium. A deposition temperature of, for example, about 500 degrees C. for silicon will be sufficient to crystallize the germanium of diodes 111, while the switchable memory element 117 remains in an amorphous state. It is preferred that germanium diodes 111 be polycrystalline, to maximize current through the diode in the on state, while it is preferred that silicon switchable memory element 117 be amorphous, to maximize the difference between various resistance states, and make these states more readily distinguishable. In less preferred embodiments, however, silicon switchable memory element 117 may be polycrystalline or microcrystalline. Similarly, while it is preferred for switchable memory element 117 to be silicon while diode 111 is germanium, either may be an alloy. For the reasons described, it is preferred for switchable memory element 117 to be formed of a semiconductor material having a higher silicon content than diode 111.

A more detailed view of germanium diode 111 having heavily doped region 112, intrinsic region 114, and heavily doped region 116, with silicon switchable memory element 117 formed adjacent to it, is shown in FIG. 8a. An alternative embodiment in which diode 111 is a p-n diode, having only heavily doped regions 112 and 116 and lacking intrinsic region 114, is shown in FIG. 8b. The polarities of the diode could be reversed, with region 112 doped with a p-type dopant and region 116 doped with an n-type dopant. In this case, to avoid formation of a diode between switchable memory element 117 and top region 116, switchable memory element 117 is preferably lightly doped with an n-type dopant.

Figure 9:
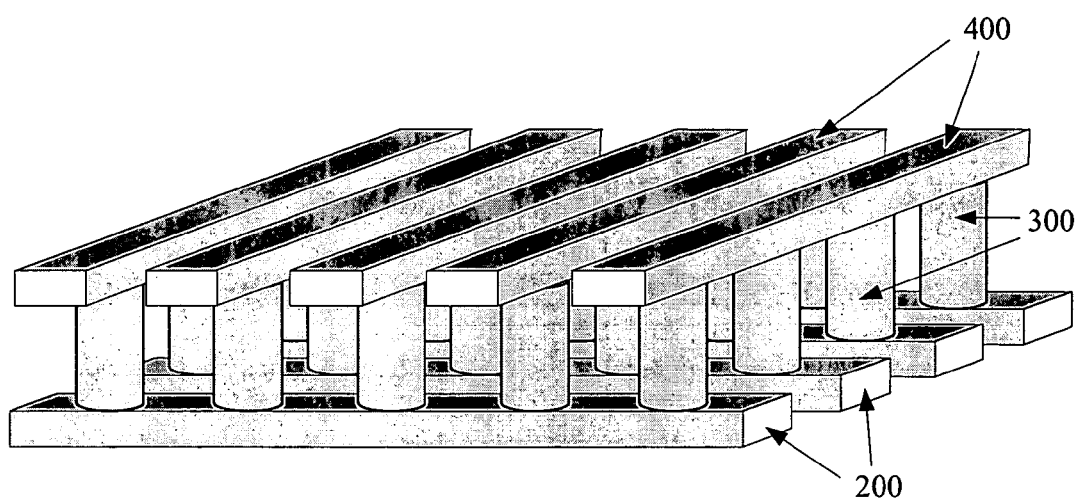
FIG. 9 is a perspective view of a memory level formed according to an embodiment of the present invention.

Completion of the memory level continues as in the previous embodiment. As in the prior embodiment, additional memory levels can be formed above this first memory level. A completed memory level (of either embodiment) is shown in FIG. 9.

Many variations can be envisioned. It would be possible, for example, to form switchable memory element 117 before diode 111, so that switchable memory element 117 is below heavily doped region 112.

In summary, then, the memory cell described is programmed by a method for changing and sensing data states in a nonvolatile memory cell, the method comprising: applying a first set voltage to a switchable memory element comprising doped semiconductor material, wherein the first set voltage changes the doped semiconductor material from a first resistivity state to a second resistivity state, the second resistivity state lower resistivity than the first resistivity state; applying a second set voltage to the switchable memory element, wherein the second set voltage changes the doped semiconductor material from the second resistivity state to a third resistivity state, the third resistivity state lower resistivity than the second resistivity state; and applying a read voltage to the switchable memory element, wherein the read voltage does not substantially change the resistance of the switchable memory element, wherein the memory cell comprises a portion of a first conductor, a portion of a second conductor, and the switchable memory element disposed between the first and second conductors, wherein the second conductor is disposed above the first conductor. The first set voltage has a first set pulse width and a first set voltage magnitude, the second set voltage has a second set pulse width and a second set voltage magnitude, and the second set voltage magnitude is greater than the first set voltage magnitude.

Subsequently, a first reset voltage can be applied to the switchable memory element, wherein the first reset voltage changes the semiconductor material from the third resistivity state to a fourth resistivity state, the fourth resistivity state higher resistivity than the third resistivity state. The first reset voltage has a first reset pulse width and a first reset voltage magnitude, wherein the first reset pulse width is at least five times the first set pulse width.

If desired, a fusing voltage pulse can be applied. The term fusing voltage pulse is used to refer to a pulse that causes the cell to behave as a fuse. Current flows across a fuse in its initial state. After a sufficiently high voltage is applied, the fuse is blown and no longer allows current to flow. Similarly, a fusing voltage pulse changes the switchable memory element to a final resistivity state, the final resistivity state higher than the first resistivity state. The fusing voltage pulse has a fusing voltage magnitude greater than the second set voltage magnitude, and, after application of the fusing voltage pulse, application of additional electrical pulses does not substantially change the resistance of the switchable memory element A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

In embodiments of the present invention, the monolithic three dimensional memory array comprising: a) a first memory level formed above a substrate, the first memory level comprising a first plurality of memory cells, wherein the selected cell is one of the first memory cells, and the selected cell comprises: i) a portion of a first conductor extending in a first direction; ii) a portion of a second conductor extending in a second direction different from the first direction, the second conductor above the first conductor; iii) a switchable memory element consisting essentially of doped semiconductor material, the switchable memory element disposed between the first conductor and the second conductor; and b) a second memory level monolithically formed above the first memory level. A cell in this monolithic three dimensional memory array can be programmed by a method comprising: applying a first set voltage to the switchable memory element wherein the first set voltage changes the switchable memory element from a first resistance state to a second resistance state, the second resistance state lower resistance than the first resistance state; applying a second set voltage to the switchable memory element, wherein the second set voltage changes the switchable memory element from the second resistance state to a third resistance state, the third resistance state lower resistance than the second resistance state, wherein the second set voltage has higher electrical amplitude than the first set voltage; and applying a read voltage to the switchable memory element, wherein the read voltage has lower electrical amplitude than the first set voltage.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for changing and sensing data states for a nonvolatile memory cell, the method comprising:
   switching silicon or a silicon alloy, or germanium or a germanium alloy semiconductor material of a semiconductor diode from a first stable resistivity state to a second stable resistivity state, the second resistivity state lower resistivity than the first resistivity state;
   switching the silicon or a silicon alloy, or germanium or a germanium alloy semiconductor material of the semiconductor diode from the second stable resistivity state to a third stable resistivity state, the third resistivity state higher resistivity than the second resistivity state; and
   sensing the first resistivity state, the second resistivity state, or the third resistivity state as a data state of the memory cell,
   wherein:
   the semiconductor diode consists essentially of the silicon or silicon alloy, or germanium or germanium alloy semiconductor material;
   at least a portion of the silicon or silicon alloy, or germanium or germanium alloy semiconductor material is doped;
   the memory cell comprises a portion of a first conductor; a portion of a second conductor; and a switchable memory element comprising the silicon or silicon alloy, or germanium or germanium alloy semiconductor material of the semiconductor diode, the switchable memory element disposed between the first and second conductors;
   the semiconductor diode in the first stable resistivity state has a first resistivity when a read voltage is applied to the semiconductor diode;
   the semiconductor diode in the second stable resistivity state has a second resistivity when the read voltage is applied to the semiconductor diode;
   the semiconductor diode in the third stable resistivity state has a third resistivity when the read voltage is applied to the semiconductor diode; and
   the first resistivity, the second resistivity, and the third resistivity are different from each other.

2. The method of claim 1 wherein the difference in resistivity between the first resistivity state and the second resistivity state is at least a factor of two.

3. The method of claim 1 wherein the difference in resistivity between the first resistivity state and the second resistivity state is at least a factor of ten.

4. The method of claim 1 wherein the at least a portion of the silicon or silicon alloy, or germanium or germanium alloy semiconductor material is doped with a p-type or n-type dopant.

5. The method of claim 1 wherein the second conductor is disposed above the first conductor, the switchable memory element vertically disposed between the first conductor and the second conductor.

6. The method of claim 1 wherein switching from the first resistivity state to the second resistivity state is achieved by applying to the switchable memory element a first electrical pulse having a first electrical amplitude and a first pulse width.

7. The method of claim 6 wherein, after switching to the second resistivity state, application of a second electrical pulse having a second electrical amplitude and a second pulse width, the second electrical amplitude no more than 120 percent of the first electrical amplitude, does not cause switching to a higher resistivity state.

8. The method of claim 6 wherein switching from the second resistivity state to the third resistivity state is achieved by application of a third electrical pulse having a third electrical amplitude and a third width, wherein the third width is at least five times the second width.

9. The method of claim 8 wherein the first pulse width is about 5 msec or less.

10. The method of claim 8 wherein the third pulse width is about 25 msec or greater.

11. The method of claim 1 wherein:
    the silicon or silicon alloy, or germanium or germanium alloy semiconductor material is a doped polycrystalline material that comprises a plurality of grain boundaries;
    at least some dopant atoms move away from at least some of the plurality of grain boundaries, during switching the silicon or silicon alloy, or germanium or germanium alloy semiconductor material from the first stable resistivity state to the second stable resistivity state; and
    at least some of the dopant atoms move to at least some of the plurality of grain boundaries, during switching the silicon or silicon alloy, or germanium or germanium alloy semiconductor material from the second stable resistivity state to the third stable resistivity state.

12. The method of claim 1 wherein:
    the silicon or silicon alloy, or germanium or germanium alloy semiconductor material is a polycrystalline material having a degree of order;
    the degree of order increases during switching the silicon or silicon alloy, or germanium or germanium alloy semiconductor material from the first stable resistivity state to the second stable resistivity state; and
    the degree of order decreases during switching the silicon or silicon alloy, or germanium or germanium alloy semiconductor material from the second stable resistivity state to the third stable resistivity state.

13. A method for changing data states for a nonvolatile memory cell, the method comprising:
    switching silicon or a silicon alloy, or germanium or a germanium alloy semiconductor material of a semiconductor diode from a first stable resistivity state to a second stable resistivity state, the second resistivity state lower resistivity than the first resistivity state, and
    switching the silicon or a silicon alloy, or germanium or a germanium alloy semiconductor material of the semiconductor diode from the second resistivity state to a third stable resistivity state, the third resistivity state lower resistivity than the second resistivity state,
    wherein:
    the semiconductor diode consists essentially of the silicon or silicon alloy, or germanium or germanium alloy semiconductor material;
    at least some portion of the silicon or silicon alloy, or germanium or germanium alloy semiconductor material is doped;
    the memory cell consists of a portion of a first conductor; a portion of a second conductor; and the semiconductor diode that functions as a switchable memory element, disposed between the portion of the first conductor and the portion of the second conductor;

the semiconductor diode in the first stable resistivity state has a first resistivity when a read voltage is applied to the semiconductor diode;

the semiconductor diode in the second stable resistivity state has a second resistivity when the read voltage is applied to the semiconductor diode;

the semiconductor diode in the third stable resistivity state has a third resistivity when the read voltage is applied to the semiconductor diode; and the first resistivity, the second resistivity, and the third resistivity are different from each other.

14. The method of claim 13 further comprising sensing the first resistivity state, the second resistivity state, or the third resistivity state as a data state of the memory cell.

15. The method of claim 13 wherein the memory cell is within a memory array, and wherein the memory array is a monolithic three dimensional memory array comprising at least two memory levels formed above a substrate.

16. The method of claim 13 wherein the step of switching the silicon or silicon alloy, or germanium or germanium alloy semiconductor material from the first resistivity state to the second resistivity state comprises applying to the switchable memory element a first electrical pulse having a first electrical amplitude and a first pulse width, and wherein the step of switching the silicon or silicon alloy, or germanium or germanium alloy semiconductor material from the second resistivity state to the third resistivity state comprises applying to the switchable memory element a second electrical pulse having a second electrical amplitude and a second width, the second electrical amplitude greater than the first electrical amplitude.

17. The method of claim 13 wherein the semiconductor diode is a junction diode.

18. The method of claim 13 wherein:

the silicon or silicon alloy, or germanium or germanium alloy semiconductor material is a doped polycrystalline material that comprises a plurality of grain boundaries; and at least some dopant atoms move away from at least some of the plurality of grain boundaries, during switching the silicon or silicon alloy, or germanium or germanium alloy semiconductor material from the first stable resistivity state to the second stable resistivity state.

19. The method of claim 13 wherein:

the silicon or silicon alloy, or germanium or germanium alloy semiconductor material is a polycrystalline material having a degree of order;

the degree of order increases during switching the silicon or silicon alloy, or germanium or germanium alloy semiconductor material from the first stable resistivity state to the second stable resistivity state; and the degree of order increases during switching the silicon or silicon alloy, or germanium or germanium alloy semiconductor material from the second stable resistivity state to the third stable resistivity state.

* * * * *